(12) United States Patent
Rock et al.

(10) Patent No.: US 12,282,075 B2
(45) Date of Patent: Apr. 22, 2025

(54) SENSOR PACKAGE AND SYSTEM

(71) Applicant: Allegro MicroSystems, LLC, Manchester, NH (US)

(72) Inventors: Simon E. Rock, Heidelberg (DE); Georges El Bacha, Manchester, NH (US); Shaun D. Milano, Charlestown, NH (US); Loïc André Messier, Vanzy (FR); Alexander Latham, Harvard, MA (US); Maxwell McNally, Manchester, NH (US); Shixi Louis Liu, Hooksett, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 446 days.

(21) Appl. No.: 17/810,353

(22) Filed: Jul. 1, 2022

(65) Prior Publication Data

US 2024/0003995 A1 Jan. 4, 2024

(51) Int. Cl.
*G01R 33/06* (2006.01)
*G01R 19/00* (2006.01)
*H05K 1/18* (2006.01)

(52) U.S. Cl.
CPC ......... *G01R 33/06* (2013.01); *G01R 19/0092* (2013.01); *H05K 1/181* (2013.01); *H05K 2201/10151* (2013.01)

(58) Field of Classification Search
None
See application file for complete search history.

(56) References Cited

U.S. PATENT DOCUMENTS

| 5,041,780 | A | 8/1991 | Rippel |
| 7,598,601 | B2 | 10/2009 | Taylor et al. |
| 8,080,994 | B2 | 12/2011 | Taylor et al. |

(Continued)

FOREIGN PATENT DOCUMENTS

CN 112649645 A 4/2021

OTHER PUBLICATIONS

Infineon Datasheet, "TLE4972-AE35D5 high precision coreless current sensor for automotive applications", Dec. 21, 2021, 20 pages.

(Continued)

*Primary Examiner* — Farhana A Hoque
(74) *Attorney, Agent, or Firm* — DALY, CROWLEY, MOFFORD & DURKEE, LLP (57) ABSTRACT

A current sensor IC includes a lead frame having a die attach pad and elongated leads extending in a single direction with respect to the die attach pad, a semiconductor die having a first surface attached to the die attach pad and a second, opposing surface supporting magnetic field sensing elements, and a non-conductive mold material. A first portion of the mold material encloses the semiconductor die and the die attach pad, a second portion of the mold material encloses a portion of the elongated leads, and the mold material further includes a wing structure between the first portion and the second portion. In assembly, the first portion of the mold material extends into a cutout through a current conductor and the wing structure abuts a surface of the conductor. The current sensor can implement differential sensing based on signals from at least two magnetic field sensing elements.

19 Claims, 9 Drawing Sheets

(56) References Cited

U.S. PATENT DOCUMENTS

| | | | |
|---|---|---|---|
| 8,847,590 | B2 | 9/2014 | Flock et al. |
| 9,299,915 | B2 | 3/2016 | Milano et al. |
| 9,411,025 | B2 | 8/2016 | David et al. |
| 9,620,705 | B2 | 4/2017 | Milano et al. |
| 10,333,055 | B2 | 6/2019 | Milano et al. |
| 10,345,343 | B2 | 7/2019 | Milano et al. |
| 10,481,181 | B2 * | 11/2019 | Bussing ............... G01R 15/207 |
| 11,150,273 | B2 | 10/2021 | Liu et al. |
| 11,226,382 | B2 | 1/2022 | Augendre et al. |
| 11,320,466 | B1 | 5/2022 | Briano et al. |
| 2021/0285794 | A1 | 9/2021 | Briano et al. |

OTHER PUBLICATIONS

Infineon Datasheet, "TLE4972-AE35S5 high precision coreless current sensor for automotive applications", Dec. 21, 2021, 20 pages.

U.S. Appl. No. 17/467,713, filed Sep. 7, 2021, Vuillermet, et al.
U.S. Appl. No. 17/651,080, filed Feb. 15, 2022, Rock, et al.
U.S. Appl. No. 17/654,254, filed Mar. 10, 2022, Boden, et al.
U.S. Appl. No. 17/657,135, filed Mar. 30, 2022, Liu, et al.
U.S. Appl. No. 17/695,193, filed Mar. 15, 2022, Messier, et al.
U.S. Appl. No. 17/804,647, filed May 31, 2022, Vuillermet, et al.
U.S. Appl. No. 17/804,654, filed May 31, 2022, Messier, et al.
U.S. Appl. No. 17/850,152, filed Jun. 27, 2022, Vuillermet, et al.
Allegro MicroSystems Datasheet ACS37612 Coreless, High Precision, Hall-Effect Current Sensor IC with Common-Mode Field Rejection and High Bandwidth (240 kHz), Mar. 9, 2020, 22 pages.
Allegro MicroSystems Datasheet ACS37610 "Coreless, High Precision, Hall-Effect Current Sensor IC with Common-Mode Field Rejection, Overcurrent and Overtemperature Detection", Mar. 22, 2021, 5 pages.
Allegro MicroSystems Datasheet ACS724 "Automotive-Grade, Galvanically Isolated Current Sensor IC with Common-Mode Field Rejection in a Small-Footprint SOIC8 Package"; May 18, 2022, 25 pages.

* cited by examiner

SENSOR PACKAGE AND SYSTEM

CROSS REFERENCE TO RELATED APPLICATIONS

Not Applicable.

STATEMENT REGARDING FEDERALLY SPONSORED RESEARCH

Not Applicable.

FIELD

The present disclosure relates generally to differential current sensor integrated circuit (IC) packages and systems.

BACKGROUND

Some conventional electrical current sensors include one or more magnetic field sensing elements positioned near a current-carrying conductor to sense a magnetic field generated by the current through the conductor. The current sensor generates an output signal having a magnitude proportional to the magnetic field induced by the current through the conductor.

A ferrite or other magnetic core is sometimes positioned around the conductor in order to concentrate the magnetic field in the vicinity of the sensor. Such a core may increase the magnitude of the magnetic field in the vicinity of the sensing elements and provide some level of shielding against stray magnetic fields, such as those that may be caused by currents flowing in adjacent conductors. If no core is used, the sensor may be referred to as a "coreless" current sensor.

Accurately measuring current through a conductor can be challenging in systems susceptible to stray magnetic fields. Placement tolerances can also present challenges. Calibration procedures are often used in an application setting (sometimes referred to as "end of line" calibration) so that compensation can be applied to reduce or eliminate sensing errors due to placement tolerances. However, such procedures can increase manufacturing time and cost.

SUMMARY

Described herein are current sensor packages and systems in which differential current sensing reduces adverse effects of stray magnetic fields and including a single in line package configuration that facilitates mounting and has a wing structure that improves consistency of mechanical mounting tolerances. With the described arrangements, highly repeatable, tightly controlled, accurate current sensor performance is achieved.

According to the disclosure, a current sensor integrated circuit includes a lead frame with a die attach pad and a plurality of elongated leads extending in a single direction with respect to the die attach pad, a semiconductor die having a first surface attached to the die attach pad and a second, opposing surface supporting a plurality of magnetic field sensing elements, and a non-conductive mold material enclosing the semiconductor die and the die attach pad of the lead frame.

Features may include one or more of the following alone or in combination. A first portion of the non-conductive mold material encloses the semiconductor die and the die attach pad of the lead frame and a second portion of the non-conductive mold material encloses a portion of the elongated leads, wherein the non-conductive mold material further includes a wing structure between the first portion and the second portion. Each of the plurality of magnetic field sensing elements can be configured to sense a magnetic field generated by a current through a bus bar having a first major surface, a second opposing major surface, and a cutout extending through the bus bar from the first major surface to the second major surface, wherein the first portion of the non-conductive mold material extends into the cutout. The first portion of the non-conductive mold material can have a dimension smaller than a dimension of the cutout, the second portion of the non-conductive mold material can have a dimension larger than the dimension of the cutout, and the wing structure can abut the second opposing major surface of the bus bar. The plurality of magnetic field sensing elements can include at least two magnetic field sensing elements, each configured to generate a respective magnetic field signal indicative of the magnetic field and wherein the semiconductor die further supports a circuit responsive to the magnetic field signals from the at least two magnetic field sensing elements and configured to generate a current sensor output signal based on a difference between the magnetic field signals from the at least two magnetic field sensing elements. The current sensor output signal is indicative of the current through the bus bar. The at least two magnetic field sensing elements can be magnetoresistance elements or Hall effect elements. A terminal end of each of the plurality of elongated leads can be configured to be attached to a substrate. The substrate can be a printed circuit board (PCB). The terminal end of each of the plurality of elongated leads can be configured for surface mount attachment to the PCB.

Also described is a current sensor system including a bus bar having a first major surface, a second opposing major surface, and a cutout extending through the bus bar from the first major surface to the second major surface, wherein the bus bar is configured to carry a current to be sensed and a current sensor integrated circuit is positioned in the cutout of the bus bar. The current sensor integrated circuit includes a lead frame with a die attach pad and a plurality of elongated leads extending in a single direction with respect to the die attach pad, a semiconductor die having a first surface attached to the die attach pad and a second, opposing surface supporting a plurality of magnetic field sensing elements configured to sense a magnetic field generated by the current through the bus bar, and a non-conductive mold material enclosing the semiconductor die and the die attach pad of the lead frame.

Features may include one or more of the following alone or in combination. A printed circuit board (PCB) can be configured to be coupled to the plurality of elongated leads. Each of the plurality of elongated leads can be configured for surface mount attachment or through hole attachment to the PCB. The plurality of magnetic field sensing elements can include at least two magnetic field sensing elements, each configured to generate a respective magnetic field signal indicative of a magnetic field generated by the current through the bus bar, wherein the semiconductor die further supports a circuit responsive to the magnetic field signals from the at least two magnetic field sensing elements and configured to generate a current sensor output signal based on a difference between the magnetic field signals from the at least two magnetic field sensing elements, wherein the current sensor output signal is electrically coupled to the PCB by one or more of the plurality of elongated leads. A first portion of the non-conductive mold material can enclose the semiconductor die and the die attach pad of the lead frame and a second portion of the non-conductive mold material can enclose a first portion of the elongated leads, wherein the non-conductive mold material further includes a wing structure between the first portion and the second portion. The first portion of the non-conductive mold material can have a dimension smaller than a dimension of the cutout and the second portion of the non-conductive mold material can have a dimension larger than the dimension of the cutout, wherein the first portion of the non-conductive mold material extends into the cutout and the wing structure abuts the second major surface of the bus bar. A creepage distance of the current sensor integrated circuit can be established by the second portion of the non-conductive mold material. A length of the second portion of the non-conductive mold material and a length of a second, exposed portion of the plurality of elongated leads can establish a distance between the bus bar and the PCB.

Also described is a current sensor system including a differential magnetic field current sensor integrated circuit, a bus bar configured to carry a current to be sensed by the differential magnetic field current sensor integrated circuit, wherein the bus bar includes a cutout in which the differential magnetic field current sensor integrated circuit is positioned, and a printed circuit board configured to be electrically coupled to one or more of the elongated leads. The differential magnetic field current sensor integrated circuit can include at least two magnetic field sensing elements configured to sense a magnetic field, wherein the differential magnetic field current sensor integrated circuit is packaged in a single in line package (SIP) including a lead frame, a plurality of elongated leads, and a non-conductive mold material having a first portion enclosing the magnetic field sensing elements and a second portion enclosing a portion of the elongated leads.

Features may include one or more of the following alone or in combination. The non-conductive mold material can include a wing structure between the first portion and the second portion. The first portion of the non-conductive mold material can have a dimension smaller than a dimension of the cutout, the second portion of the non-conductive mold material can have a dimension larger than the dimension of the cutout, and the wing structure can abut a surface of the bus bar.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
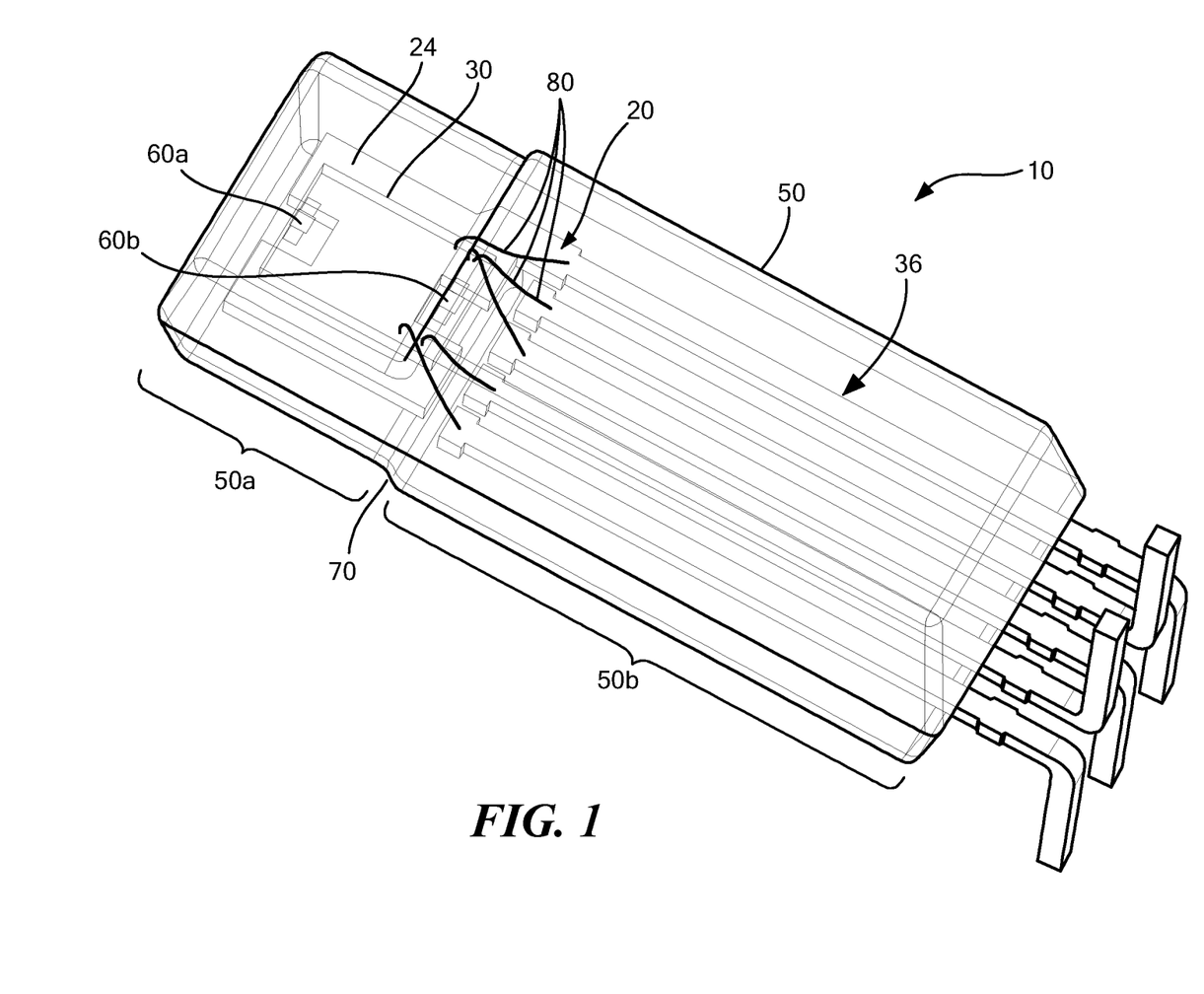
FIG. 1 is a transparent perspective view of a current sensor IC according to the disclosure.
Figure 1A:
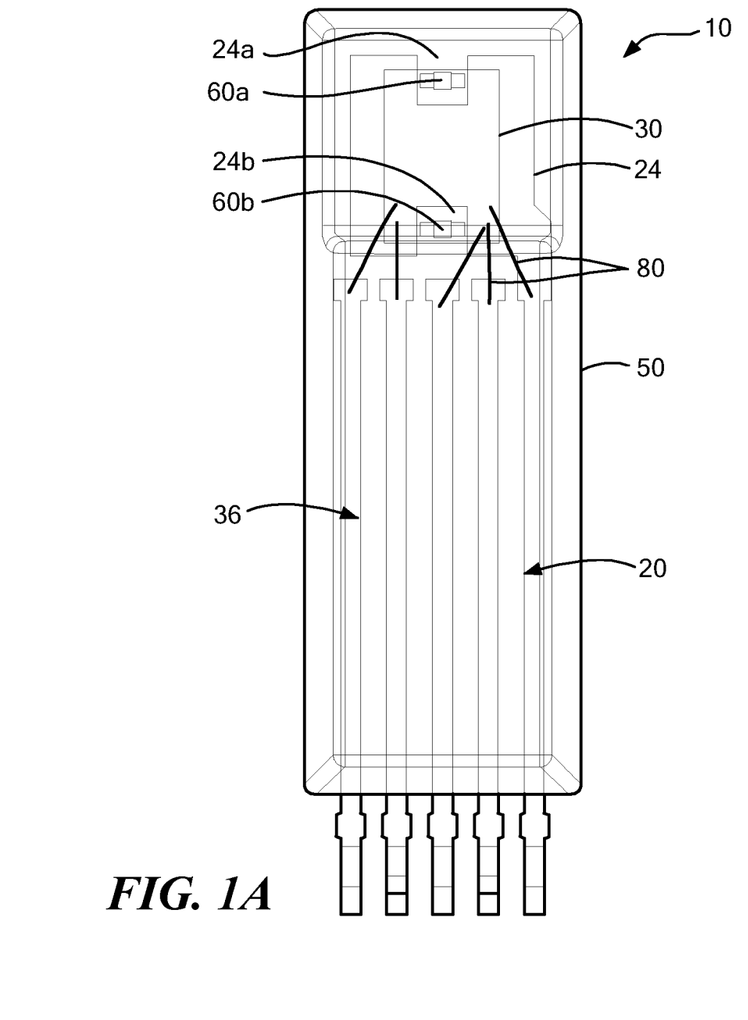
FIG. 1A is a plan view of the current sensor IC of FIG. 1.
Figure 1B:
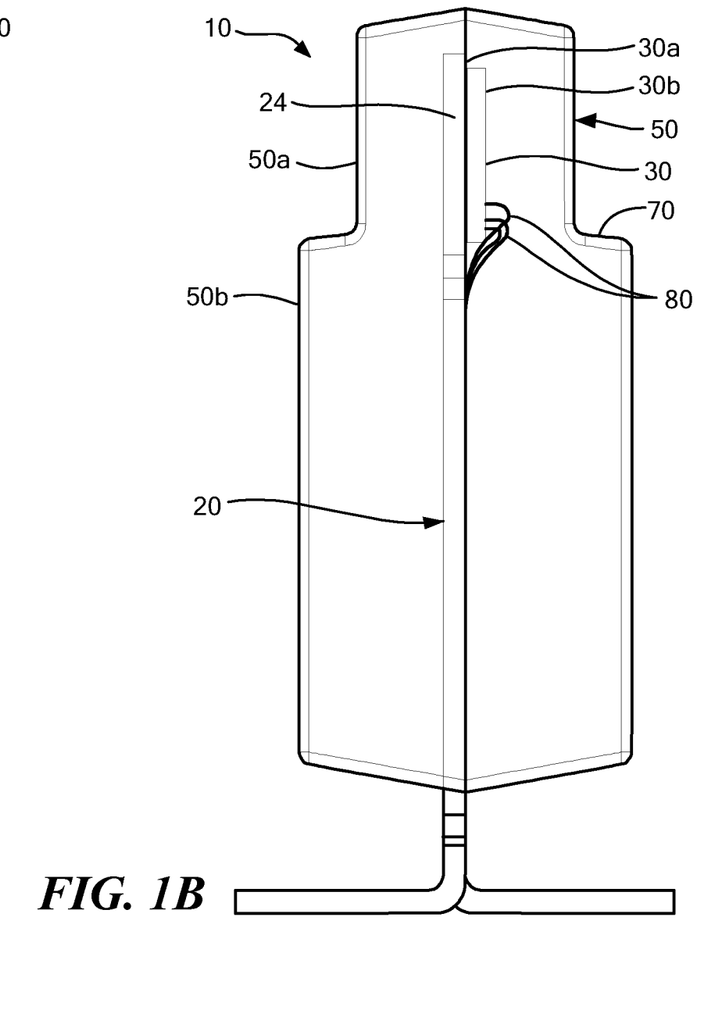
FIG. 1B is a side view of the current sensor IC of FIG. 1.
Figure 2:
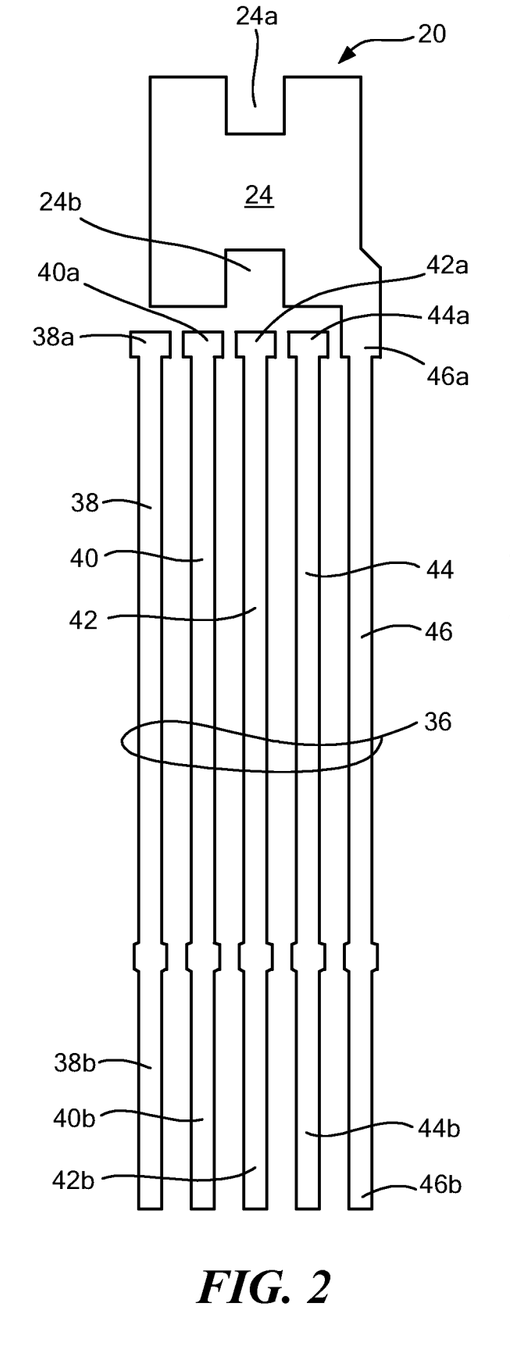
FIG. 2 is a plan view of the lead frame of the current sensor IC of FIG. 1.

Referring to FIGS. 1, 1A, and 1B, a current sensor integrated circuit (IC) 10 includes a lead frame 20, a semiconductor die 30, and a non-conductive mold material 50 enclosing the die and a portion of the lead frame. As is also shown in FIG. 2, the lead frame 20 has a die attach pad 24 and a plurality of elongated leads 36 that extend in a single direction from the die attach pad. The semiconductor die 30 has a first surface 30a attached to the die attach pad 24 and a second, opposing surface 30b supporting a plurality of magnetic field sensing elements 60a, 60b. The non-conductive mold material 50 encloses the semiconductor die 30 and the die attach pad 24 of the lead frame 20.

Figure 6:
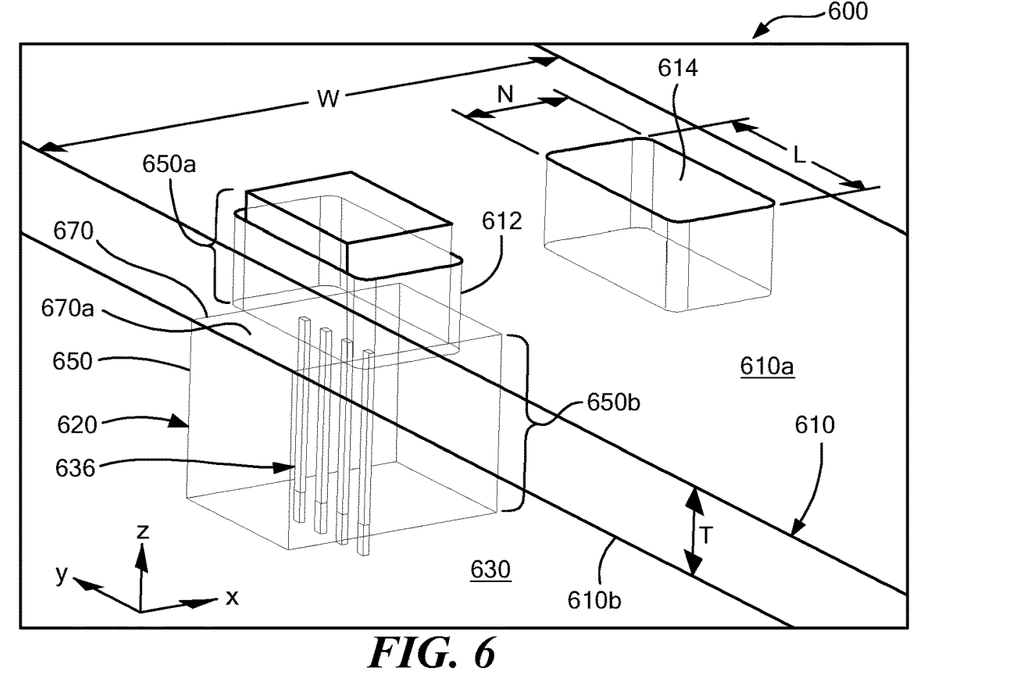
FIG. 6 shows a current sensor system including a current sensor IC, a bus bar, and a printed circuit board according to the disclosure.
Figure 6A:
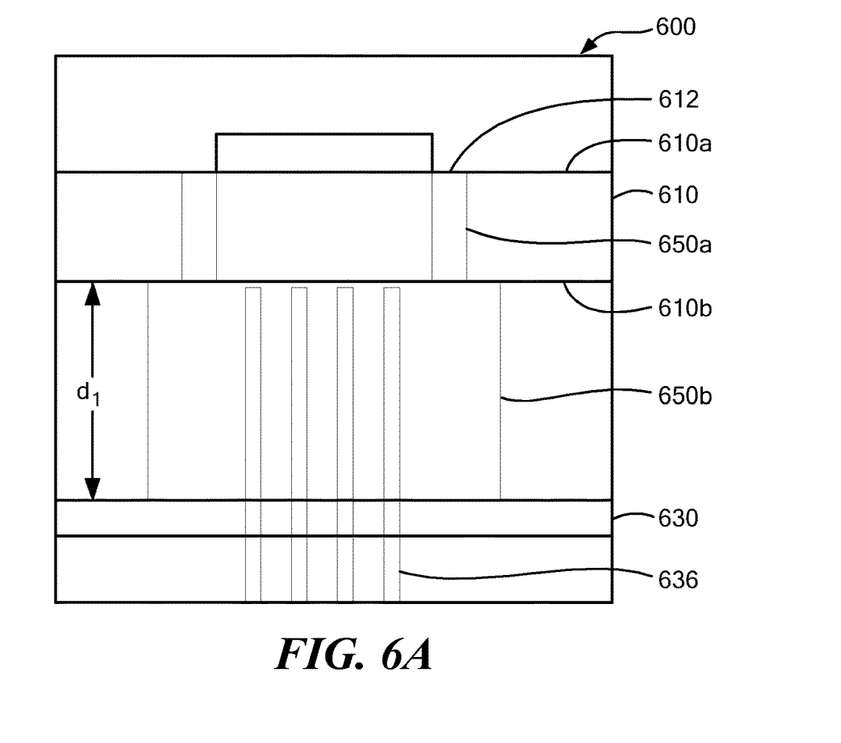
FIG. 6A is a side view of the current sensor system of FIG. 6.
Figure 7:
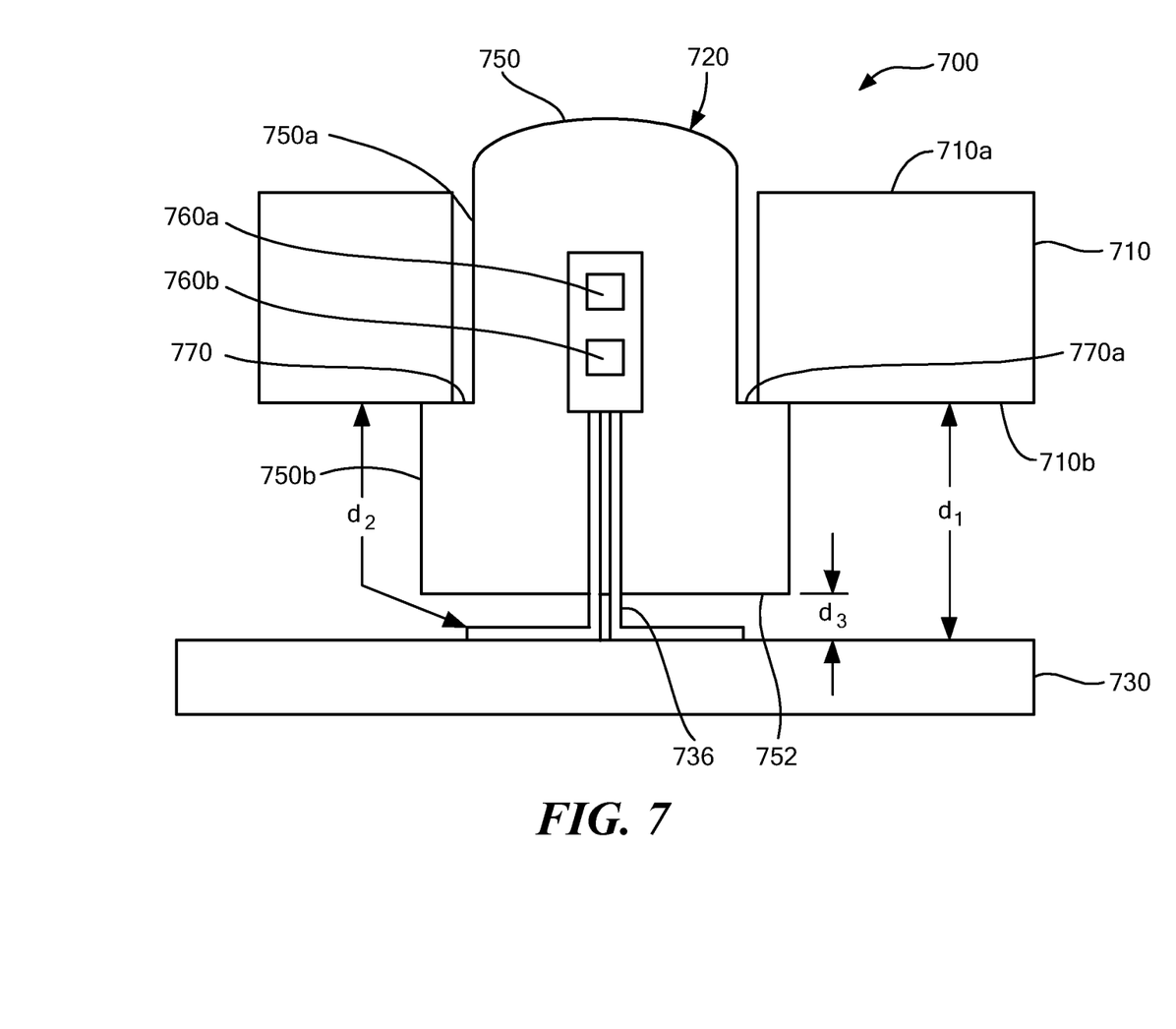
FIG. 7 shows an alternative current sensor system including a current sensor IC, a bus bar, and a printed circuit board according to the disclosure.

In use, the current sensor IC 10 is positioned proximate to a current conductor (e.g., as shown in FIGS. 6, 6A, and 7) and the magnetic field sensing elements 60a, 60b sense a magnetic field generated by a current flow through the conductor. An output signal of the current sensor IC 10 is indicative of the sensed current and can be coupled to external circuits and/or systems by one or more of the elongated leads 36 configured for coupling to a substrate, such as a printed circuit board (PCB). The current conductor can take various forms, such as a bus bar as shown in FIGS. 6, 6A, and 7 as will be described. Suffice it to say here that mechanical mounting tolerances that affect positioning of the magnetic field sensing elements 60a, 60b with respect to the conductor can adversely affect the accuracy of current sensor measurements and features described herein tighten mechanical mounting tolerances thereby improvising current sensing accuracy.

In embodiments, current sensor IC 10 implements differential sensing, meaning that the magnetic field generated by the current through the conductor is sensed by at least two spaced sensing elements 60a, 60b that experience opposite polarities of the magnetic field. A sensor output signal that is indicative of the current through the conductor can be generated by computing a difference between the magnetic field signals. This arrangement can provide immunity to the adverse effects of stray magnetic fields.

More particularly, the plurality of magnetic field sensing elements can include at least two magnetic field sensing elements 60a, 60b, each configured to generate a respective magnetic field signal indicative of a sensed magnetic field. The semiconductor die 30 can support circuitry responsive to the magnetic field signals from the at least two magnetic field sensing elements 60a, 60b and configured to generate a current sensor output signal based on a difference between the magnetic field signals from the at least two magnetic field sensing elements. When positioned in a current sensor system (e.g., FIGS. 6, 6A, and 7), the sensing elements 60a, 60b can be positioned with respect to the conductor in a way that presents the magnetic field of a first polarity to one sensing element and of a second, opposite polarity to the other sensing element as will be described.

With the described current sensor package arrangement including elongated leads 36 extending in a single direction from the die attach pad 24, mounting flexibility is achieved which facilitates meeting tight mounting tolerances. Further, meeting tight mounting tolerances can improve current sensing accuracy. Such an IC package configuration with elongated leads extending in a single direction is sometimes referred to as a single in line package (SIP).

A first portion 50a of the non-conductive mold material 50 encloses the semiconductor die 30 and the die attach pad 24 of the lead frame 20 and a second portion 50b of the non-conductive mold material 50 encloses a portion of the elongated leads 36. According to an aspect of the disclosure, the non-conductive mold material 50 includes a wing structure 70 between the first portion 50a and the second portion 50b.

The wing structure 70 can facilitate mounting the current sensor IC 10 with respect to the proximate conductor in a consistent, repeatable, and accurate manner as will be explained further in connection with FIGS. 6, 6A, and 7. Suffice it here to say that the wing structure 70 facilitates meeting tight mounting tolerances by providing a consistent distance between the conductor and PCB, as can reduce sensing errors and improve the resulting current sensing accuracy. As will become apparent, the wing structure 70 can establish a conductor to substrate creepage that is a shortest distance between the current conductor and the substrate to which the current sensor is mounted (e.g., as labeled "d1" in FIGS. 6 and 7). Maintaining minimum creepage distances is important to meet required voltage isolation requirements.

The magnetic field sensing elements 60a, 60b and other circuitry supported by the semiconductor die 30 can be coupled to external circuits and/or systems by one of more of the elongated leads 36. Wire bonds 80 can electrically couple elements and circuitry supported by the semiconductor die 30 to the leads 36, as shown. It will be appreciated by those of ordinary skill in the art that bond pads can be provided on the semiconductor die 30 and plated areas on the leads 36 to facilitate wire bond attachment, such as by thermosonic, ultrasonic or thermocompression bonding method.

Referring also to FIG. 2, each of the elongated leads 36 of lead frame 20 has a first end proximate to the die attach pad 24 and a second end distal from the die attach pad. For example, leads 38-46 have first ends 38a-46a proximate to the die attach pad 24 and second, terminal ends 38b-46b distal from the die attach pad as shown. While the IC 10 is shown to have five elongated leads 36, it will be appreciated that other numbers and configurations of leads are possible. In the illustrated embodiment, lead 46 is coupled to the die attach pad 24, as shown.

The terminal ends 38b-46b of the elongated leads 38-46 are configured for electrical connection to a substrate, such as a printed circuit board (PCB) as shown in FIGS. 6, 6A and 7. Lead ends 38b-46b can be formed according to the type of mounting desired. For example, lead ends 38b-46b can be bent as shown in FIGS. 1-1B for surface mount attachment to a PCB. Alternatively, as shown in FIGS. 6 and 6A, lead ends 38b-46b can be straight for through-hole mounting to a PCB.

The die attach pad 24 can have notches 24a, 24b that are substantially vertically aligned with magnetic field sensing elements 60a, 60b in assembly. For example, as shown in FIG. 1A, notch 24a can be substantially vertically aligned with magnetic field sensing element and notch 24b can be substantially vertically aligned with magnetic field sensing element Notches 24a, 24b can reduce adverse effects of eddy currents on the lead frame.

Figure 2A:
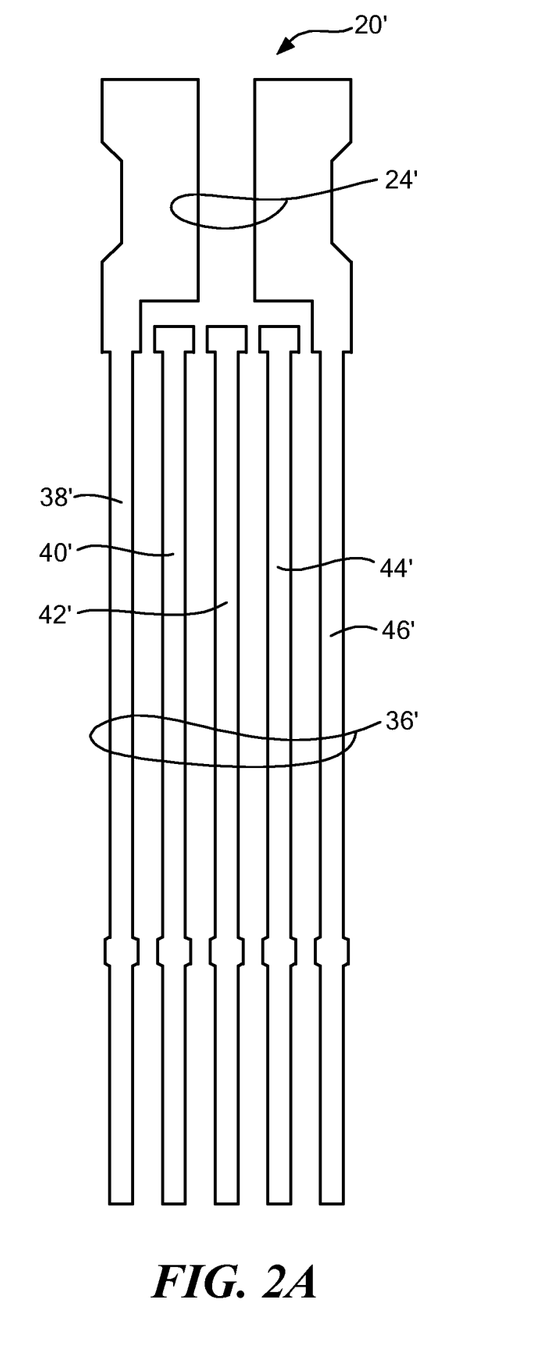
FIG. 2A is a plan view of an alternative lead frame.

Various manufacturing techniques are possible for providing the lead frame 20, such as stamping for example. Further, various alternative lead frame designs are possible, such as the lead frame 20' shown in FIG. 2A. Like lead frame 20, lead frame 20' has a die attach pad 24' and a plurality of elongated leads 36' that extend in a single direction from the die attach pad. Lead frame 20' differs from lead frame 20 in that the die attach pad 24' is split, with a lead 38' coupled to one side of the split die attach pad 24' and a lead 46' attached to the other side, as shown. Further lead frame 20' does not include notches (e.g., notches 24a, 24b of FIG. 2) since the split die attach pad 24' does not have lead frame material under the sensing elements once the die is mounted to the split pad.

Figure 3:
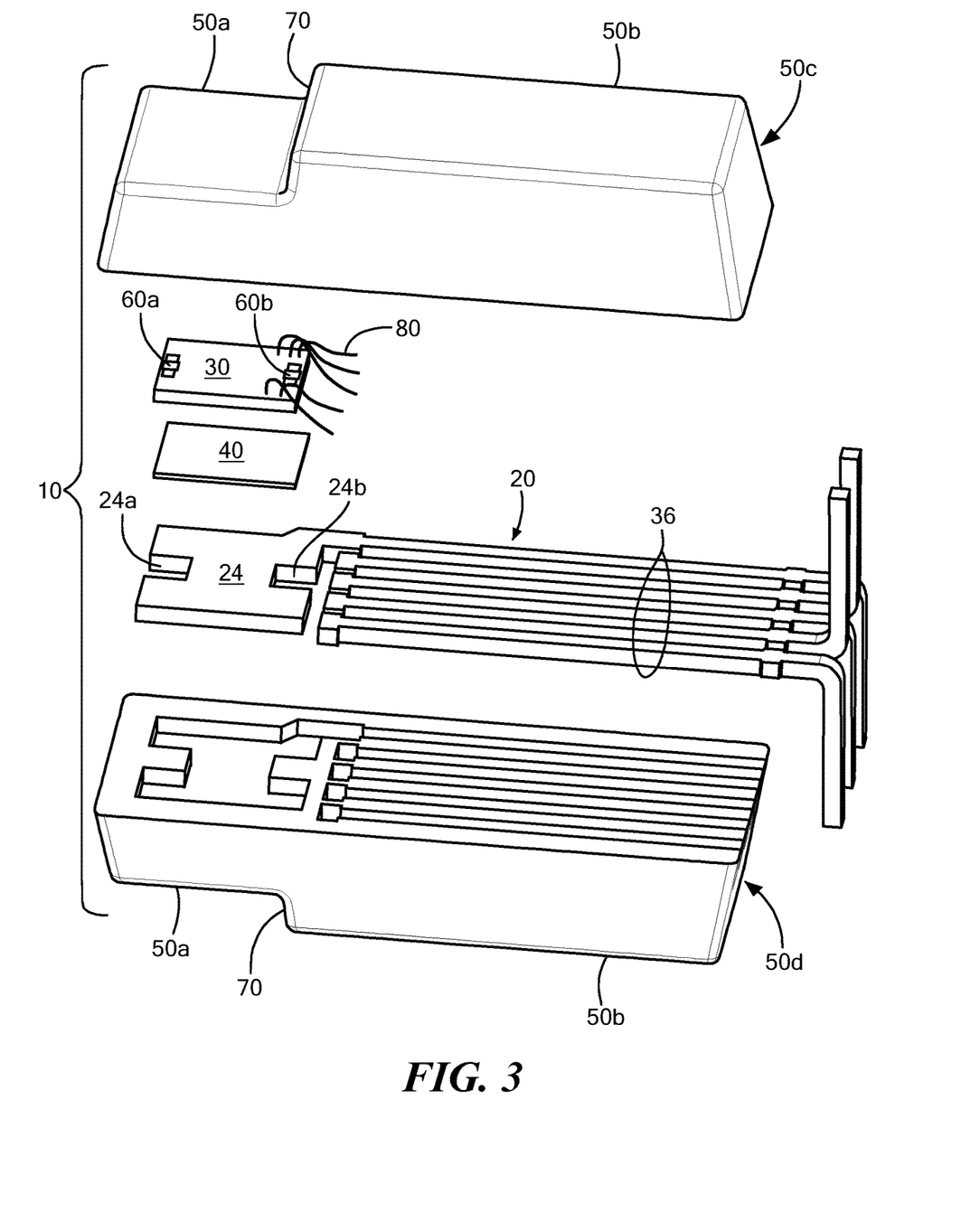
FIG. 3 is an exploded view of the current sensor IC of FIG. 1.

Referring also to FIG. 3, an exploded view of the current sensor IC 10 illustrates that the non-conductive mold material 50 can be formed in two portions 50c, 50d, such as by transfer molding. Mold portion 50d can have indentations designed to receive lead frame 20, as shown.

The current sensor IC 10 can include a die attach material 40, as may take the form of a wafer backside coating for example. Die attach material 40 can be screen printed on the backside of the wafer forming the semiconductor die 30. Also shown in FIG. 3 are wire bonds 80 with which elements and circuitry supported by the substrate 30 can be attached to leads 36.

Figure 4:
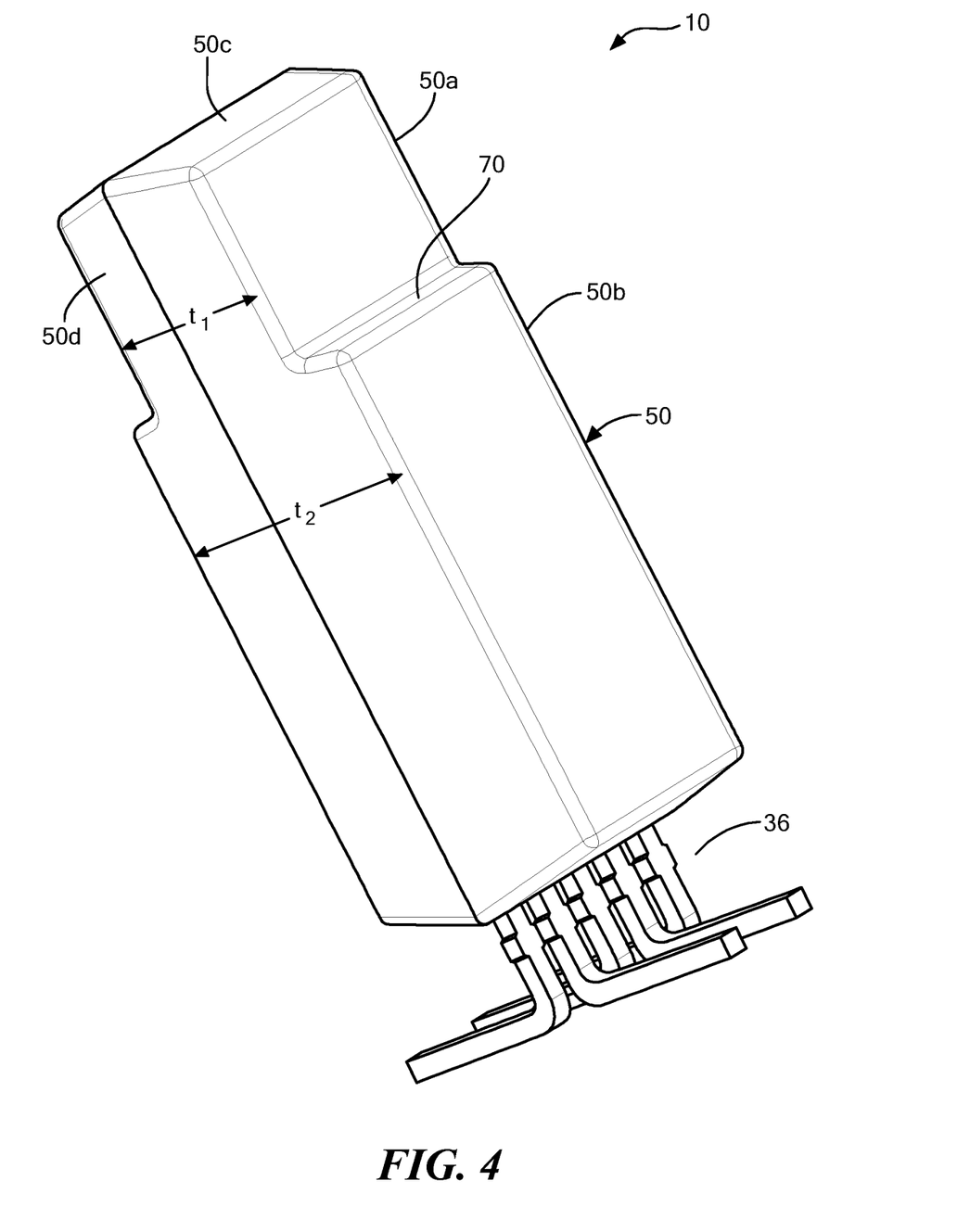
FIG. 4 is a perspective view of the current sensor IC of FIG. 1.

Referring also to FIG. 4, the packaged current sensor IC 10 is shown with the non-conductive mold material portions 50c, 50d molded together. Wing structure 70 separates the first portion 50a of the mold material 50 from the second portion 50b of the mold material. In embodiments, the first portion 50a of the non-conductive mold material 50 has a dimension smaller than a dimension of the second portion 50b of the non-conductive mold material, as shown. For example, a thickness t1 of the first mold portion 50a can be less than a thickness t2 of the second mold portion 50b.

Figure 5:
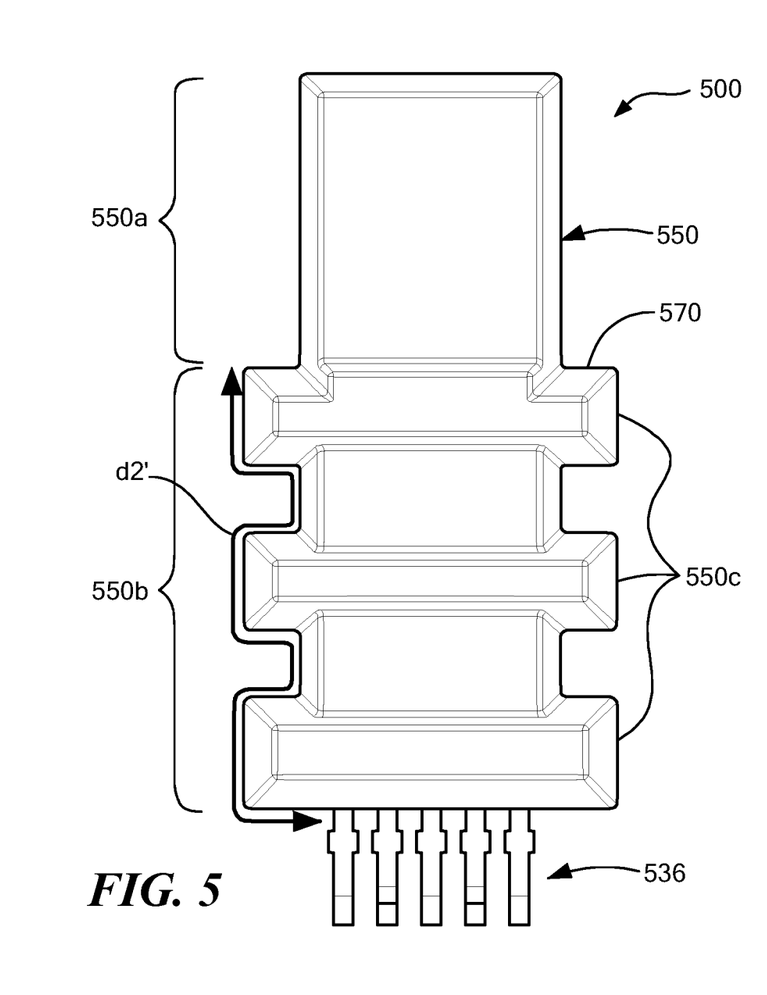
FIG. 5 is a plan view of an alternative current sensor IC according to the disclosure.
Figure 5A:
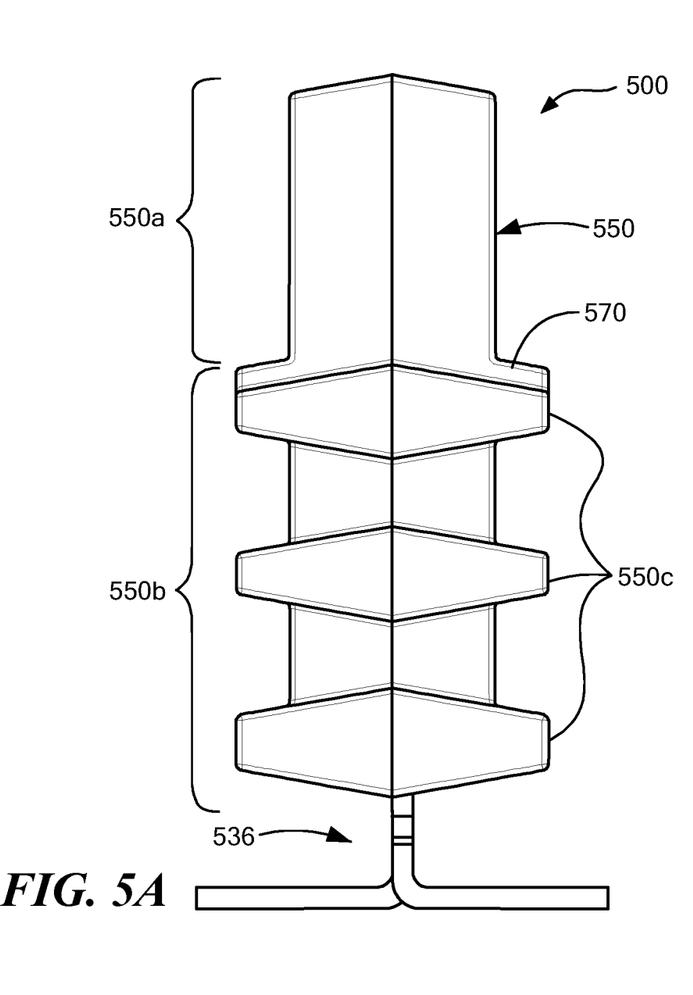
FIG. 5A is a side view of the current sensor IC of FIG. 5.

Referring also to FIG. 5, an alternative current sensor IC 500 has a different non-conductive mold material 550 than mold material 50 of current sensor 10, but in other respects current sensor IC 500 can be substantially the same as or similar to current sensor 10. In particular, the mold material 550 has a first portion 550a that encloses a semiconductor die and die attach pad of a lead frame (i.e., that can be the same as or similar to mold material portion that encloses the die 30 and the die attach pad 24 of lead frame 20) and a second portion 550b that encloses a portion of the elongated leads 536 (i.e., that can be the same as or similar to mold material portion 50b that encloses a portion of the elongated leads 36).

A wing structure 570 can be formed between the first portion 550a and the second portion 550b, as shown. In use, a conductor (not shown) abuts the wing structure 570.

Mold material 550 differs from mold material 50 in that the second portion 550b has features 550c designed to increase the package creepage distance, which refers to a shortest distance from a conductor (not shown) to the exposed portion of the elongated leads 536. The package creepage distance between the wing structure 570 (which abuts the conductor in use) and an exposed portion of leads 536 is labeled "d2'". By increasing the package creepage distance, the current sensor integrated circuit can be made smaller but still meet the minimum creepage requirement.

Features 550c, as may take the illustrated form of protrusions. It will be appreciated by those of ordinary skill in the art that mold material features 550c are illustrative only and may take various forms. As one example, more or less than three protrusions can make up features 550c and such protrusions can take different shapes and dimensions than shown and than each other.

Referring also to FIGS. 6 and 6A, a current sensor system 600 includes a current sensor 620, a current conductor 610, and a substrate 630. The current sensor 620 can be the same as or similar to current sensor 10 of FIGS. 1-1B for example, with at least the exception that current sensor 620 is shown to have four elongated leads 636 rather than the five leads 36 of current sensor 10. Current sensor 620 includes a mold material 650 having a first portion 650a, a second portion 650b, and a wing structure 670 between the first and second portions.

The current conductor 610 is configured to carry a current to be sensed by the current sensor 620 and one or more signals generated by the current sensor can be indicative of the current and can be coupled to external circuits and systems by leads 636 that have terminal ends configured for coupling to the substrate 630, such as a PCB. While leads 636 are illustrated as being configured for through hole mounting to the substrate 630, it will be appreciated that other mounting arrangements, such as surface mounting of the leads to the substrate, are possible.

The conductor 610 can take the form of a bus bar or other conductor having a width "W", a thickness "T", a first major surface 610a, and a second, opposing major surface 610b. Conductor 610 may be formed from a conductive material, such as copper.

Conductor 610 has one or more cutouts or through holes 612, 614 each configured to receive a respective current sensor. For example, cutouts 612, 614 can each have a width "N" and a length "L" (labeled for cutout 614). The first portion 650a of the non-conductive mold material 650 of the current sensor 620 has a dimension smaller than a dimension (e.g., width "N") of the cutout 612, a second portion 650b of the non-conductive mold material 650 has a dimension larger than the dimension of the cutout 612, such that once assembled, a surface 670a the wing structure 670 abuts the second opposing major surface 610b of the conductor 610 and the first portion 650a is positioned at least partially in cutout 612. For illustration clarity, cutout 614 is shown without receiving a current sensor IC; however, it will be appreciated by those of ordinary skill in the art that, in use, another current sensor IC can be positioned in cutout 614. The first portion 650a of the mold material 650 can protrude above the surface 610a of the bus bar 610 as shown or it can extend into the cutout 612 but without extending through the entire bus bar thickness T.

The wing structure surface 670a can be considered to form a "ledge" or "shoulder" which abuts the conductor surface 610b so as to precisely position the current sensor package with respect to the conductor 610. It will be appreciated by those of ordinary skill in the art that the wing structure 670 can have various shapes and sizes to achieve this functionality.

The conductor cutouts 612, 614 can have various shapes and sizes and, in general, are designed to receive a first portion of the mold material of the current sensor 620 but to be too small to receive the second portion of the mold material. It will be appreciated by those of ordinary skill in the art that the number of cutouts 612, 614 and their placement can be varied and can be designed based on the conductor thickness T and width W. Cutouts 612, 614 can be formed in the conductor by any suitable process such as drilling. For example, cutouts 612, 614 can be in the form of slits or slots and can be substantially rectangular as shown or other shapes.

In some embodiments, the cutouts 612, 614 can be offset with respect to a center of the width W of the conductor 610, as shown. Positioning and geometry of the cutouts 612, 614 can be designed to optimize the AC performance of the sensor IC (i.e., performance at higher frequencies), particularly due to skin effect.

Since the presence of eddy currents can adversely influence the accuracy of sensing an intended current flow through the conductor, reducing eddy currents can improve overall accuracy of the current sensor system.

Although not required, current sensor 620 can be positioned so that its magnetic field sensing element(s) are at least generally centered with respect to the thickness T of the conductor 610. The placement direction that is most significant to current sensing accuracy is the accuracy with which the sensor 620 is positioned in the labeled z-axis direction. Positional tolerances in the x-axis and y-axis directions are less significant.

Referring also to FIG. 6A, a side view of the current sensor system 600 is shown. The first portion 650a of the mold material 650 extends through the bus bar cutout 612 and the second portion 650b of the mold material 650 is larger than the cutout 612 in at least one dimension (here along the x-axis), so that the wing feature 670 abuts the surface 610b of the conductor 610, as shown.

Distance "d1" between the conductor 610 and the substrate 630, as can be referred to as the bus bar to PCB creepage, is designed to meet safety isolation requirements between the typically relatively high voltage at the conductor 610 as compared to the substrate 630. In an example embodiment, such distance d1 can be on the order of 5 mm to 15 mm, depending on application voltage isolation requirements.

The wing structure 670 permits mounting of the current sensor IC 620 in a consistent, repeatable, and accurate manner with respect to the proximate conductor 610. In other words, because the busbar 610 "sits on" the package 650, the distance between the sensing elements and the bus bar (which distance can be referred to as "airgap") does not vary for different busbars. With the described configuration, calibration can be performed once in a manufacturing setting, such as in a "dummy" application configuration, rather than in an "end of line" application setting, since there will be a repeatable consistent spacing regardless of the bus bar. Stated differently, because the described arrangement essentially eliminates particularly z-axis position tolerances, it reduces or eliminates the need for end of line calibration.

Referring also to FIG. 7, a diagrammatical side view of an alternative current sensor system 700 is shown to include a current sensor 720 having a plurality of elongated leads 736 extending in a single direction, and a plurality of magnetic field sensing elements 760a, 760b with which differential current sensing can be implemented. Current sensor 720 can be substantially similar to current sensor 10 (FIG. 1).

A non-conductive mold material 750 includes a first portion 750a enclosing the semiconductor die that supports the sensing elements 760a, 760b and the die attach pad of the lead frame and a second portion 750b enclosing a portion of the elongated leads 736. A wing structure 770 of the non-conductive mold material 750 separates the first mold material portion 750a from the second mold material portion 750b and includes a surface 770a.

In use, current sensor 720 can be electrically coupled to a substrate, or PCB 730, such as by surface mount attachment. The first portion 750a of the mold material 750 can extend into and through the cutout in a proximate conductor, or bus bar 710, as shown. Bus bar 710 can have a first major surface 710a and a second, opposing major surface 710b. Once assembled, the surface 770a of the wing structure 770 can abut the surface 710b of the bus bar 710, as shown.

A conductor to substrate creepage distance which refers to a shortest distance from the current conductor 710 to the substrate 730 to which the current sensor is mounted is labeled "d1". A package creepage distance between wing structure 770 and an exposed portion of leads 736 is labeled "d2" and in some embodiments can be on the order of 10 mm. A standoff distance between a bottom surface 752 of the mold material 750 and the PCB 730 is labeled "d3".

The closer the sensing elements 760a, 760b are to each other, the better the rejection to stray magnetic fields; however, the further apart the sensing elements 760a, 760b are with respect to each other, the larger the resulting differential signal and the better the signal to noise ratio. Furthermore, the further the sensing elements 760a, 760b are from the conductor 710, the smaller the resulting signal strength. Thus, the spacing between sensing elements 760a, 760b can be optimized to account for these competing requirements accordingly. Furthermore, generally, the element spacing is dictated by the dimensions of the sensor IC package.

The specific spacing between current sensor 720 and its sensing elements 760a, 760b with respect to the conductor 710 may be designed based at least in part on the dimensions of the current sensor (and its magnetic field sensing elements) and the conductor, the sensitivity of the magnetic field sensing elements within the current sensor, and/or the level of current intended to be measured.

Process steps for assembly of the current sensor system 700 can include attaching the current sensor 720 to the substrate 730, such as by the illustrated surface mount attachment. The subassembly including the substrate 730 and current sensor 720 can then be mounted to the bus bar 710.

Although not shown, additional features of the current sensor 720 can include one or more support pins extending from a bottom surface 752 of the mold material portion 750b proximate to the PCB 730 to or through the PCB. For example, such support pin(s) can be surface mount or through hole attached to the PCB and can be provided for mechanical stability of the current sensor once mounted.

Further, one or more alignment pins (not shown) can extend from a surface 770a of the wing structure 770 to mate with one or more complementary alignment holes on the bottom surface 710 of the bus bar 710 in order to facilitate mounting of the subassembly including the substrate 730 and current sensor 720 to the bus bar 710.

Figure 8:
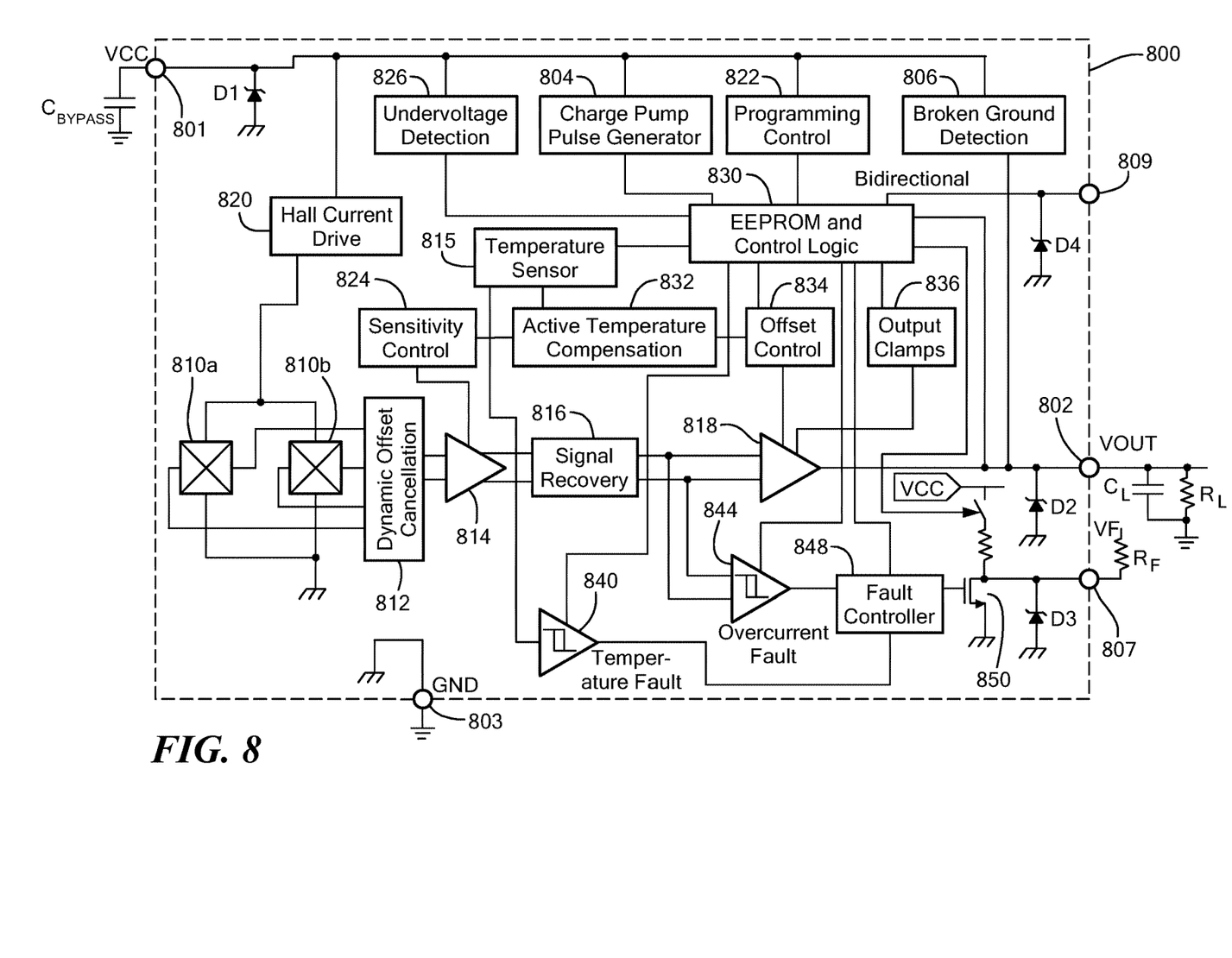
FIG. 8 is a schematic showing example circuitry of a current sensor IC according to the disclosure.

Referring to FIG. 8, a schematic block diagram of an example current sensor 800 that can be the same as or similar to current sensor 10 includes one or more magnetic field sensing elements, and here two sensing elements 810a, 810b. Sensing elements 810a, 810b can be Hall effect elements or other magnetic field transducer element types. It will be appreciated that sensor 800 is presented as a non-limiting example of circuitry suitable for sensor 10 according to the disclosure.

Use of two or more sensing elements 810a, 810b permits differential magnetic field sensing, as may be advantageous to improve immunity (i.e., insensitivity) to common-mode stray magnetic fields. The output of the sensor VOUT is proportional to $\Delta B = B_R - B_L$ where $B_R$ represents magnetic field incident on one of the sensing elements (e.g., so-called "right" sensing element 810b) and $B_L$ represents magnetic field incident on the other one of the sensing elements (e.g., so-called "left" sensing element 810a).

Current sensing accuracy is affected by mechanical mounting tolerances of the sensor 800 (e.g., especially along the z-axis of FIG. 6). By tightly controlling the position of sensing elements 810a, 810b in the conductor cutouts (e.g., cutouts 612, 614 of FIG. 6), sensitivity to mechanical mounting tolerances can be lower than otherwise possible.

Sensing accuracy is further affected by the skin effect in the conductors. The term "bandwidth" is used herein to refer to the range of conductor current frequency for which the output of the sensor is not significantly affected by the frequency. Advantageously, the bandwidth of a sensor system can be tuned by adjusting the position of the conductor cutouts 612, 614 along the x-axis.

While differential sensing may be implemented, for example using two sensing elements 810a, 810b as shown, in some embodiments, the current sensor 800 can include only a single sensing element. It will be appreciated that in embodiments in which a current sensor has only a single sensing element, the current sensor is positioned in the respective conductor cutout so that the single sensing element is offset from the center of the conductor width along the z-axis. Furthermore, it will also be appreciated that differential sensing can be implemented using more than two sensing elements and can include the use of sensing elements arranged in a bridge configuration.

Example current sensor 800 includes a VCC (supply voltage) pin 801, a VOUT (output signal) pin 802, and a GND (ground) pin 803. The VCC pin 801 is used for the input power supply or supply voltage for the current sensor 800. A bypass capacitor, $C_{BYPASS}$, can be coupled between the VCC pin 801 and ground. The VCC pin 801 can also be used for programming the current sensor 800. The VOUT pin 802 is used for providing the output signal of the current sensor 800 to circuits and systems (not shown) and can also be used for programming. An output load capacitance $C_L$ is coupled between the VOUT pin 802 and ground. The example current sensor 800 can include a first diode D1 coupled between the VCC pin 801 and chassis ground and a second diode D2 coupled between the VOUT pin 802 and chassis ground.

Magnetic field signals generated by the magnetic field sensing elements 810a, 810b are coupled to a dynamic offset cancellation circuit 812, which is further coupled to an amplifier 814. The amplifier 814 is configured to generate an amplified signal for coupling to the signal recovery circuit 816. Dynamic offset cancellation circuit 812 may take various forms including chopping circuitry and may function in conjunction with offset control 834 to remove offset that can be associated with the magnetic field sensing elements 810a, 810b and/or the amplifier 814. For example, offset cancellation circuit 812 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 800 to regulate the supply voltage.

A programming control circuit 822 is coupled between the VCC pin 801 and EEPROM and control logic 830 to provide appropriate control to the EEPROM and control logic circuit. EEPROM and control logic circuit 830 determines any application-specific coding and can be erased and reprogrammed using a pulsed voltage. A sensitivity control circuit 824 can be coupled to the amplifier 814 to generate and provide a sensitivity control signal to the amplifier 814 to adjust a sensitivity and/or operating voltage of the amplifier. An active temperature compensation circuit 832 can be coupled to sensitivity control circuit 824, EEPROM and control logic circuit 830, and offset control circuit 834. The offset control circuit 834 can generate and provide an offset signal to a push/pull driver circuit 818 (which may be an amplifier) to adjust the sensitivity and/or operating voltage of the driver circuit. The active temperature compensation circuit 832 can acquire temperature data from EEPROM and control logic circuit 830 via a temperature sensor 815 and perform necessary calculations to compensate for changes in temperature, if needed. Output clamps circuit 836 can be coupled between the EEPROM and control logic 830 and the driver 818 to limit the output voltage and for diagnostic purposes. For example, if the total output range can be from 0V to 5V, for magnetic fields from 0G to 1000G, it may be desired to use a clamp at 0.5V for any field below 100G. For example, it may be known that below 100G, the sensor 800 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 826 can operate to detect an undervoltage condition of the supply voltage level VCC.

It will be appreciated that while FIG. 8 shows an example current sensor 800 primarily as a digital implementation, any appropriate current sensor can be used in accordance with the present disclosure, including both digital, analog, and combined digital and analog implementations.

Diagnostic circuitry can be provided such as a broken ground detection circuit 806, a temperature fault comparator 840, an overcurrent fault comparator 844, and a fault controller 848. A fault signal driver 850 can include a switch and a protection diode D3 can be provided at a fault output pin 807 of the IC 10. A communication connection 809 can be coupled to the EEPROM and control logic 830 and to a protection diode D4 and can provide a mechanism for communication between the sensor IC 10 and external circuits and systems, such as for parameter selection and programming purposes.

As used herein, the term "magnetic field sensing element" is used to describe a variety of electronic elements that can sense a magnetic field. The magnetic field sensing element can be, but is not limited to, a Hall-effect element, fluxgate element, magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. For example, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Accordingly, it is submitted that the scope of the patent should not be limited to the described embodiments but rather should be limited only by the spirit and scope of the following claims.

What is claimed is:

1. A current sensor integrated circuit comprising:
a lead frame comprising a die attach pad and a plurality of elongated leads extending in a single direction with respect to the die attach pad;
a semiconductor die having a first surface attached to the die attach pad and a second, opposing surface supporting a plurality of magnetic field sensing elements; and
a non-conductive mold material enclosing the semiconductor die and the die attach pad of the lead frame,
wherein a first portion of the non-conductive mold material encloses the semiconductor die and the die attach pad of the lead frame and wherein a second portion of the non-conductive mold material encloses a portion of the elongated leads, wherein the non-conductive mold material further comprises a wing structure between the first portion and the second portion, and
wherein each of the plurality of magnetic field sensing elements is configured to sense a magnetic field generated by a current through a bus bar having a first major surface, a second opposing major surface, and a cutout extending through the bus bar from the first major surface to the second major surface, wherein the first portion of the non-conductive mold material extends into the cutout.

2. The current sensor integrated circuit of claim 1, wherein the first portion of the non-conductive mold material has a dimension smaller than a dimension of the cutout, the second portion of the non-conductive mold material has a dimension larger than the dimension of the cutout, and wherein the wing structure abuts the second opposing major surface of the bus bar.

3. The current sensor integrated circuit of claim 1, wherein the plurality of magnetic field sensing elements comprises at least two magnetic field sensing elements, each configured to generate a respective magnetic field signal indicative of the magnetic field and wherein the semiconductor die further supports a circuit responsive to the magnetic field signals from the at least two magnetic field sensing elements and configured to generate a current sensor output signal comprising a difference between the magnetic field signals from the at least two magnetic field sensing elements.

4. The current sensor integrated circuit of claim 3, wherein the current sensor output signal is indicative of the current through the bus bar.

5. The current sensor integrated circuit of claim 3, wherein the at least two magnetic field sensing elements comprise magnetoresistance elements or Hall effect elements.

6. The current sensor integrated circuit of claim 1, wherein a terminal end of each of the plurality of elongated leads is configured to be attached to a substrate.

7. The current sensor integrated circuit of claim 6, wherein the substrate comprises a printed circuit board (PCB).

8. The current sensor integrated circuit of claim 7, wherein the terminal end of each of the plurality of elongated leads is configured for surface mount attachment to the PCB.

9. A current sensor system comprising:
a bus bar having a first major surface, a second opposing major surface, and a cutout extending through the bus bar from the first major surface to the second major surface, wherein the bus bar is configured to carry a current to be sensed;
a current sensor integrated circuit positioned in the cutout of the bus bar and comprising:
a lead frame comprising a die attach pad and a plurality of elongated leads extending in a single direction with respect to the die attach pad;
a semiconductor die having a first surface attached to the die attach pad and a second, opposing surface supporting a plurality of magnetic field sensing elements configured to sense a magnetic field generated by the current through the bus bar; and
a non-conductive mold material enclosing the semiconductor die and the die attach pad of the lead frame.

10. The current sensor system of claim 9, further comprising a printed circuit board (PCB) configured to be coupled to the plurality of elongated leads.

11. The current sensor system of claim 10, wherein each of the plurality of elongated leads is configured for surface mount attachment or through hole attachment to the PCB.

12. The current sensor system of claim 10, wherein the plurality of magnetic field sensing elements comprises at least two magnetic field sensing elements, each configured to generate a respective magnetic field signal indicative of a magnetic field generated by the current through the bus bar, wherein the semiconductor die further supports a circuit responsive to the magnetic field signals from the at least two magnetic field sensing elements and configured to generate a current sensor output signal comprising a difference between the magnetic field signals from the at least two magnetic field sensing elements, wherein the current sensor output signal is electrically coupled to the PCB by one or more of the plurality of elongated leads.

13. The current sensor system of claim 10, wherein a first portion of the non-conductive mold material encloses the semiconductor die and the die attach pad of the lead frame and wherein a second portion of the non-conductive mold material encloses a first portion of the elongated leads, wherein the non-conductive mold material further comprises a wing structure between the first portion and the second portion.

14. The current sensor system of claim 13, wherein the first portion of the non-conductive mold material has a dimension smaller than a dimension of the cutout and the second portion of the non-conductive mold material has a dimension larger than the dimension of the cutout, wherein the first portion of the non-conductive mold material extends into the cutout and the wing structure abuts the second major surface of the bus bar.

15. The current sensor system of claim 14, wherein a creepage distance of the current sensor integrated circuit is established by the second portion of the non-conductive mold material.

16. The current sensor system of claim 14, wherein a length of the second portion of the non-conductive mold material and a length of a second, exposed portion of the plurality of elongated leads establish a distance between the bus bar and the PCB.

17. A current sensor system comprising:
a differential magnetic field current sensor integrated circuit comprising at least two magnetic field sensing elements configured to sense a magnetic field, wherein the differential magnetic field current sensor integrated circuit is packaged in a single in line package (SIP) comprising a lead frame, a plurality of elongated leads, and a non-conductive mold material having a first portion enclosing the magnetic field sensing elements and a second portion enclosing a portion of the elongated leads;
a bus bar configured to carry a current to be sensed by the differential magnetic field current sensor integrated circuit, wherein the bus bar comprises a cutout in which the differential magnetic field current sensor integrated circuit is positioned; and
a printed circuit board configured to be electrically coupled to one or more of the elongated leads.

18. The current sensor system of claim 17, wherein the non-conductive mold material further comprises a wing structure between the first portion and the second portion.

19. The current sensor system of claim 18, wherein the first portion of the non-conductive mold material has a dimension smaller than a dimension of the cutout, the second portion of the non-conductive mold material has a dimension larger than the dimension of the cutout, and wherein the wing structure abuts a surface of the bus bar.

* * * * *